(12) United States Patent
Hsu et al.

(10) Patent No.: US 7,993,153 B2
(45) Date of Patent: Aug. 9, 2011

(54) BURN-IN SOCKET ASSEMBLY WITH LOADING MEMBER HAVING POSITIONING CLUMPS

(75) Inventors: Hsiu-Yuan Hsu, Tu-Cheng (TW);
Kenzo Nakao, Yokohama (JP);
Shih-Wei Hsiao, Tu-Cheng (TW);
Ming-Lun Szu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/909,846

(22) Filed: Oct. 22, 2010

(65) Prior Publication Data

US 2011/0097921 A1    Apr. 28, 2011

(30) Foreign Application Priority Data

Oct. 22, 2009    (TW) ................................ 098219493

(51) Int. Cl.
*H01R 13/62*    (2006.01)

(52) U.S. Cl. ........................................................ 439/331

(58) Field of Classification Search ................ 139/331, 139/70–71, 69, 387, 73, 330, 342, 266
See application file for complete search history.

(56) References Cited

U.S. PATENT DOCUMENTS

| | | | | |
|---|---|---|---|---|
| 6,570,398 B2 * | 5/2003 | Murphy et al. | ........... | 324/756.07 |
| 6,752,645 B2 * | 6/2004 | Nakamura et al. | ............ | 439/330 |
| 6,945,792 B2 * | 9/2005 | Hayakawa | ...................... | 439/73 |
| 7,097,488 B2 * | 8/2006 | Hayakawa et al. | ........... | 439/331 |
| 7,195,507 B2 * | 3/2007 | Watanabe | ...................... | 439/331 |
| 7,566,237 B2 * | 7/2009 | Gattuso et al. | ................ | 439/331 |
| 7,785,124 B2 | 8/2010 | Lin et al. | | |
| 2009/0317988 A1 | 12/2009 | Lin | | |

* cited by examiner

*Primary Examiner* — Jean F Duverne
(74) *Attorney, Agent, or Firm* — Andrew C. Cheng; Wei Te Chung; Ming Chieh Chang

(57) ABSTRACT

A burn-in socket assembly for receiving an IC package has a base defining a cavity for receiving the IC package and a loading member retained in the cavity. The loading board has a bottom plate for loading the IC package, a plurality of positioning clumps and a plurality of positioning tabs. The bottom plate defines a plurality of passageways. The positioning clumps are assembled upon the bottom plate, and the positioning tabs detachably insert into corresponding passageways of the bottom plate from the bottom to the top to retain the positioning clump to the bottom plate. The positioning clumps cooperatively define a rectangular opening for positioning the IC package.

5 Claims, 6 Drawing Sheets

BURN-IN SOCKET ASSEMBLY WITH LOADING MEMBER HAVING POSITIONING CLUMPS

FIELD OF THE INVENTION

The present invention relates to a burn-in socket assembly, and particularly to a socket assembly in which a loading member having a plurality of positioning clumps mounted on a bottom plate thereof to define an opening for an IC package to be tested.

DESCRIPTION OF RELATED ART

Burn-in socket assembly is an indispensable equipment for ensuring proper function of an IC package before it is delivered. US Patent Application Publication No. 2009-0317988 discloses such a burn-in socket adapted for connecting an IC (integrated circuit) package and a printed circuit board. The burn-in socket comprises a base having a rectangular configuration, a plurality of contacts received in the base, an adapter assembled within the base and a lid assembled on the base and movable with respect to the base. The base has a cavity surrounded by a bottom wall and a plurality of sidewalls thereof. The adapter is received on the bottom of the cavity of the base and supports the IC package. The adapter comprises a loading board and a positioning board assembled upon the loading board and defines an opening on a center thereof to position the IC package.

When testing the IC package, the IC package is loaded on the adapter and then downwardly pressed and contact with the contacts. Since the adapter of the burn-in socket has a two-pieces configuration, so people only need to change the positioning board of the adapter to suit another IC package (not shown) with a different size, so the burn-in socket can be repeatedly used for different IC packages. However, the problem is we still need to manufacture the another positioning board to suit the another IC packages.

Hence, an improved burn-in socket assembly is required to overcome the above-mentioned disadvantages of the related art.

SUMMARY OF THE INVENTION

An object of the present invention is to provide a burn-in socket assembly with an adapter, which has a loading board for loading an IC package therein and a plurality of positioning clumps mounted upon the loading board for positioning the IC package.

To achieve the aforementioned object, a burn-in socket for receiving an IC package, comprises a base defining a cavity for receiving the IC package and a loading member retained in the cavity. The loading member has a loading board and a plurality of positioning clumps, and the loading board has a bottom plate for loading the IC package. The positioning clump has an L shape configuration and is detachably assembled upon the bottom plate to define a rectangular opening for positioning the IC package, together with other positioning clumps.

Other objects, advantages and novel features of the invention will become more apparent from the following detailed description of a preferred embodiment when taken in conjunction with the accompanying drawings.

DETAILED DESCRIPTION OF THE INVENTION

Figure 1:
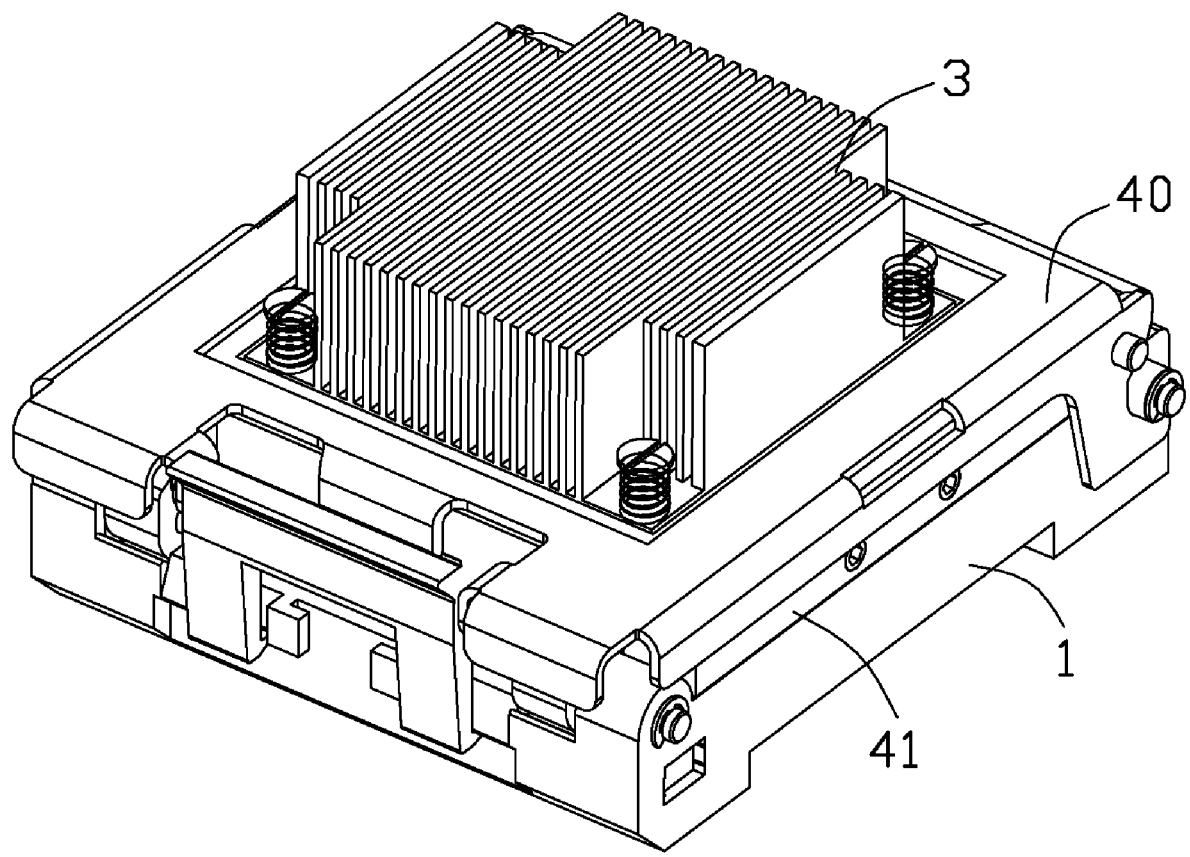
FIG. 1 is an assembled, perspective view of a burn-in socket assembly in accordance with present invention.
Figure 2:
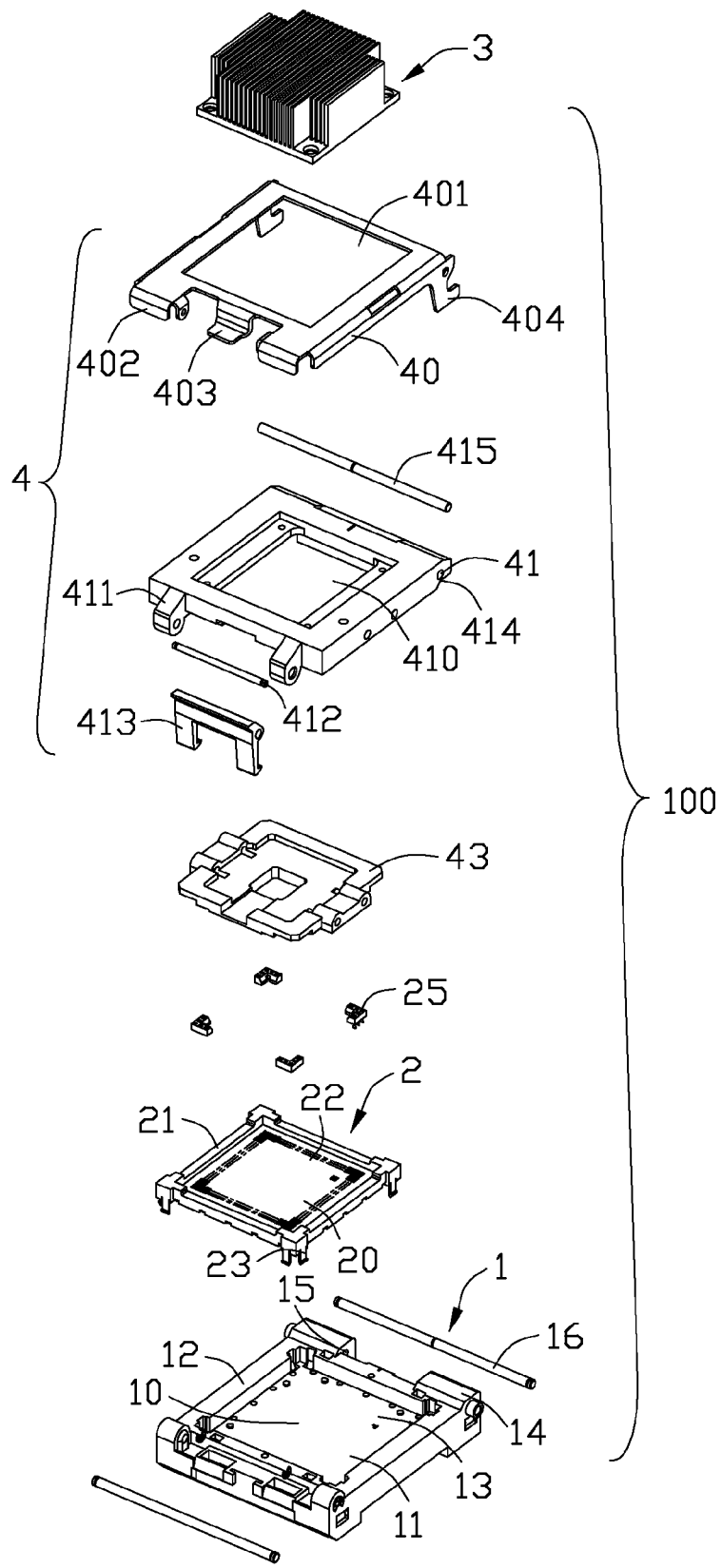
FIG. 2 is an exploded, perspective view of the burn-in socket assembly in accordance with present invention.

Referring to FIGS. 1-2, a burn-in socket assembly 100 in accordance with the present invention is disclosed. The burn-in socket assembly 100 is assembled on a testing circuit board (not shown) for receiving an IC (integrated circuit) package, and comprises a base 1, a plurality of contacts (not shown) received in the base 1, a loading member 2 assembled within the base 1, a lid 4 pivotally assembled to the base 1 and a hear sink 3 assembled on the lid 4.

Referring to FIG. 2, the base 1 has a rectangular configuration and has a bottom wall 11, a plurality of sidewalls 12 upwardly extending from a peripheral of the bottom wall 11 and a rectangular cavity 10 surrounded by the bottom wall 11 and the sidewalls 12. The base 1 defines a plurality of receiving holes 13 on the bottom wall 11 under the cavity 10. Two protrusions 14 are disposed on two opposite sides of an end of the base 1, and a pivoting hole 15 is formed on an inner surface of the protrusion 14 and passes through the protrusion 14 for receiving a shaft 16.

The lid 4 comprises an upper cover 40, a lower cover 41 and a locking member 43. The lower cover 41 has a lower hatch 410 and two ears 411 protruding outwardly from two opposite sides of a front end thereof. The locking member 413 is pivotally assembled to the ears 411 by a linking shaft 412. The lower cover 412 further has two pole holes 414 on a rear end thereof. The upper cover 40 has an upper hatch 401 corresponding to the lower hatch 410 of the lower cover 41, two bending portions 402 are formed on two opposite sides of a front end of the upper cover 40 corresponding to the ears 411 and are bent downwardly, and a tongue 403 is disposed between the bending portions 402 which is bent downwardly from the upper cover 40 and extends forwardly. The tongue 403 sets below the locking member 413 when the lid 4 is located in a closed state as shown in FIG. 1. The upper cover 40 defines pole holes (not labeled) on a rear end thereof, so that another linking shaft 415 can pivotally assemble the upper cover 40 to the lower cover 41 by passing through the pole holes 414 of both the upper and the lower cover 40, 41. The upper cover 40 further has two clasps 404 extending downwardly and forwardly from the rear end thereof, the clasp 404 latches with two ends of the shaft 16 to pivotally assemble the lid 4 to the base 1. A heat sink 3 is assembled upon the lid 4 by screw (not shown), the heat sink 3 and the locking member 43 can rotate following with the lid 4.

Referring to FIGS. 3-6, and conjoined with FIG. 2, the loading member 2 is received on the bottom of the cavity 10 of the base 1, and comprises a loading board which has a bottom plate 20 for loading the IC package (not shown) and a plurality of rims 21 upwardly protruding from a peripheral of the bottom plate 20, the bottom plate 20 has a plurality of passageways 22 in vertical alignment with the corresponding receiving holes of the base 1. The bottom plate 2 further has a plurality of latching arms 23 downwardly extending from an outer side of four corners thereof to retain the loading member 2 within the base 1.

The loading member 2 further comprises a plurality of positioning clumps 25 and a plurality of positioning tabs 26 retaining the positioning clumps 25 to the loading board. The positioning clump 25 has an L-shape configuration and mounted on four corners of the bottom plate 20 to define a rectangular opening. The positioning clump 25 defines a plurality of slots 250 recessed from a top surface thereof and passing through the positioning clump 25 for receiving corresponding positing tabs 26. The positioning clump 25 has an inclined guiding surface 251 on an inner side surface thereof to guide the IC package (not shown) smoothly to a correct position. The positioning clump 25 has a plurality of positioning posts 252 protruding downwardly from a bottom surface thereof. The position post 252 can be selectively assembled to different passageways 22. The positioning tab 26 is stamped from a metal piece, and comprises a central section 261 with a substantial rectangular configuration, a header section 262 extending upwardly and narrowing gradually from the central section 261 and a tail 263 extending downwardly and widening gradually from the central section 261.

Figure 3:
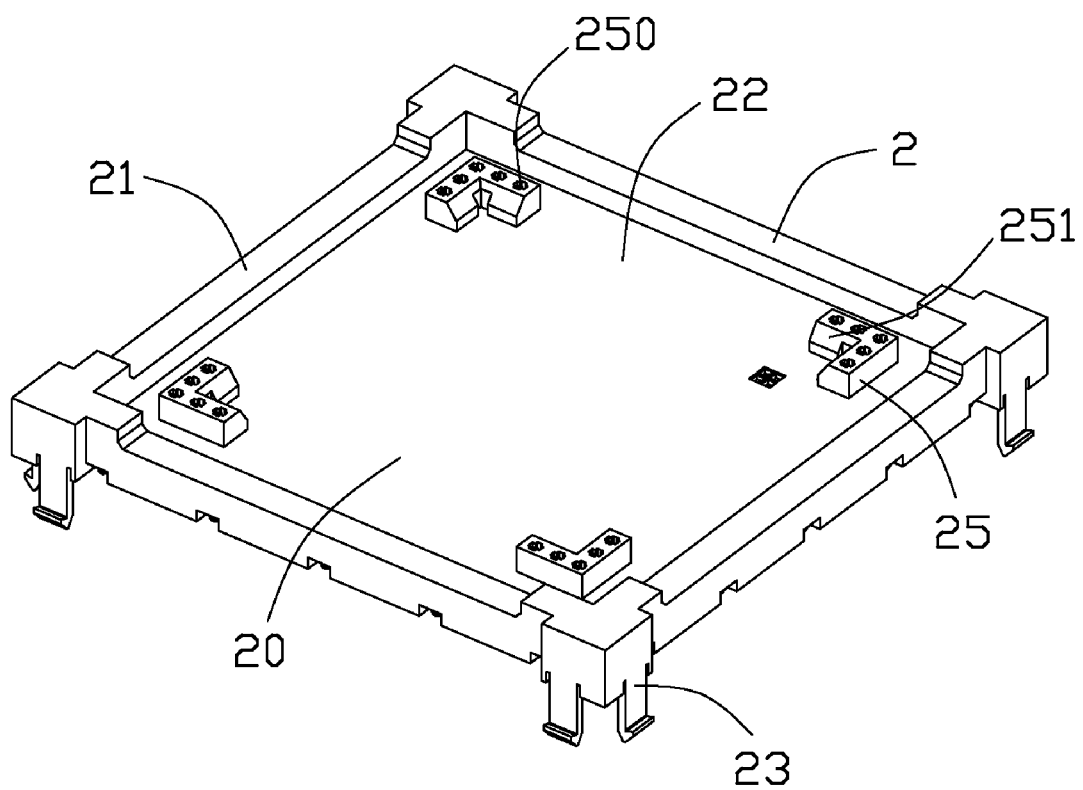
FIG. 3 is an assembled, perspective view of an adapter of the burn-in socket assembly in accordance with present invention.
Figure 4:
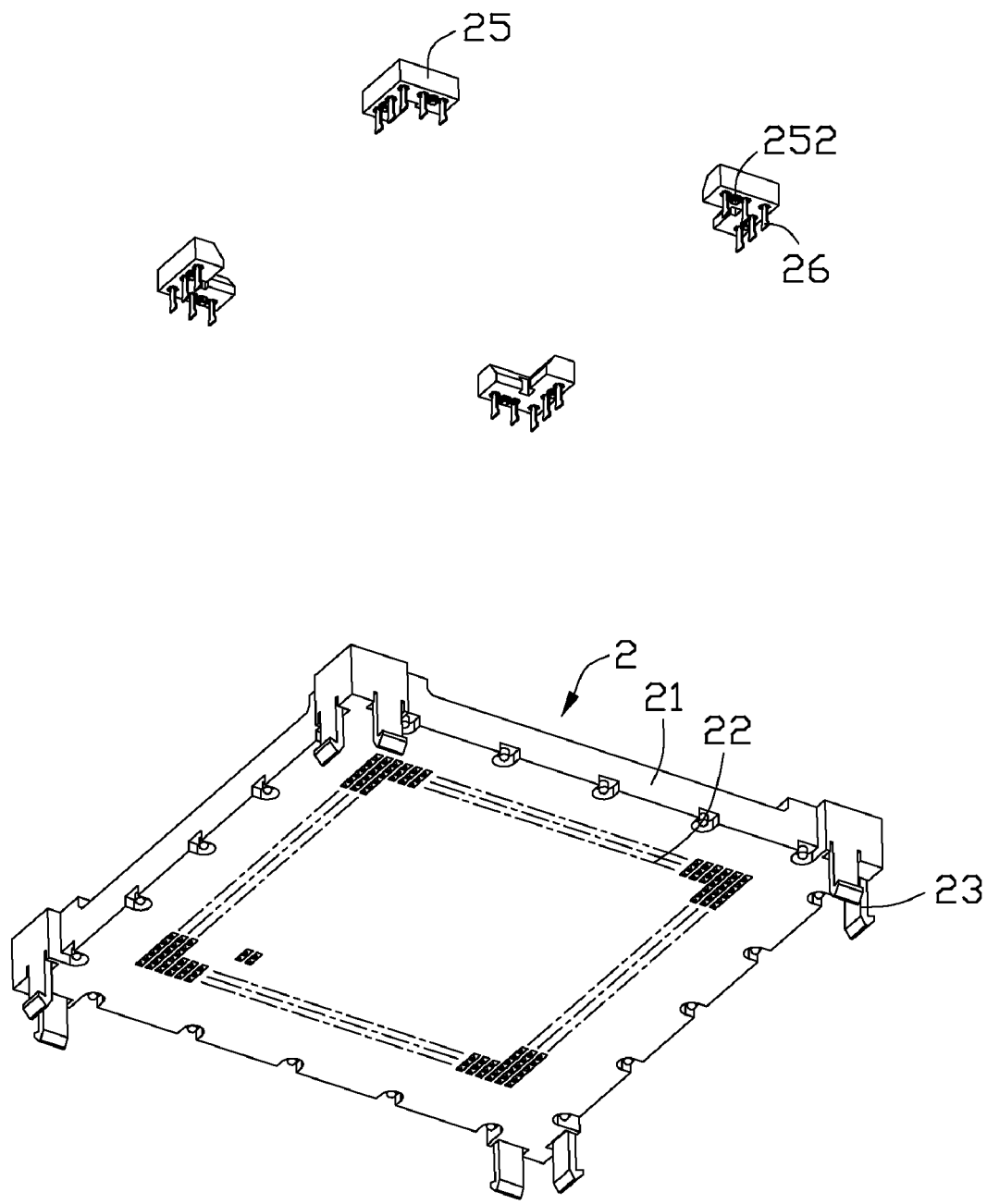
FIG. 4 is a partially exploded, perspective view of the adapter in FIG. 3.
Figure 5:
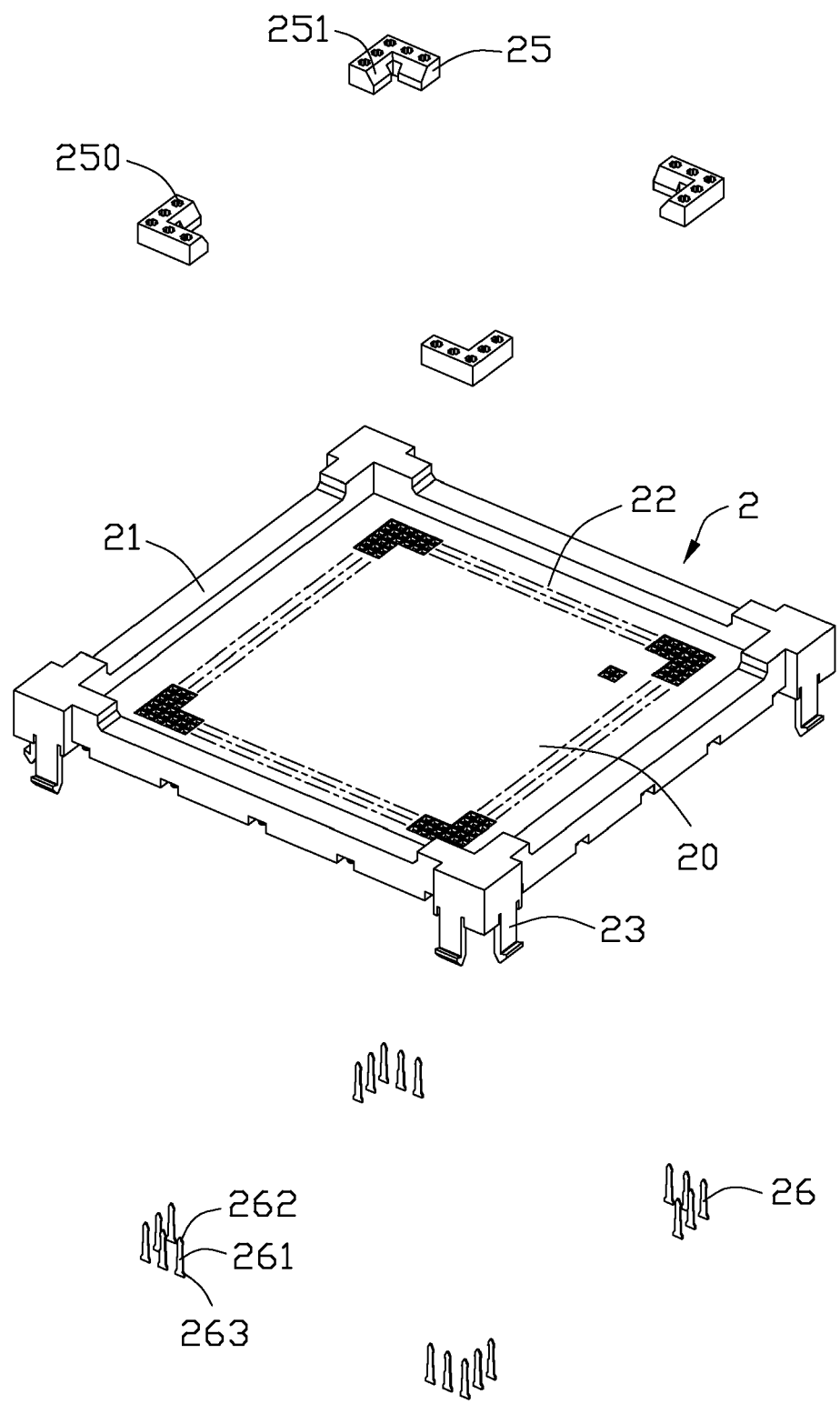
FIG. 5 is an exploded, perspective view of the adapter in FIG. 3.
Figure 6:
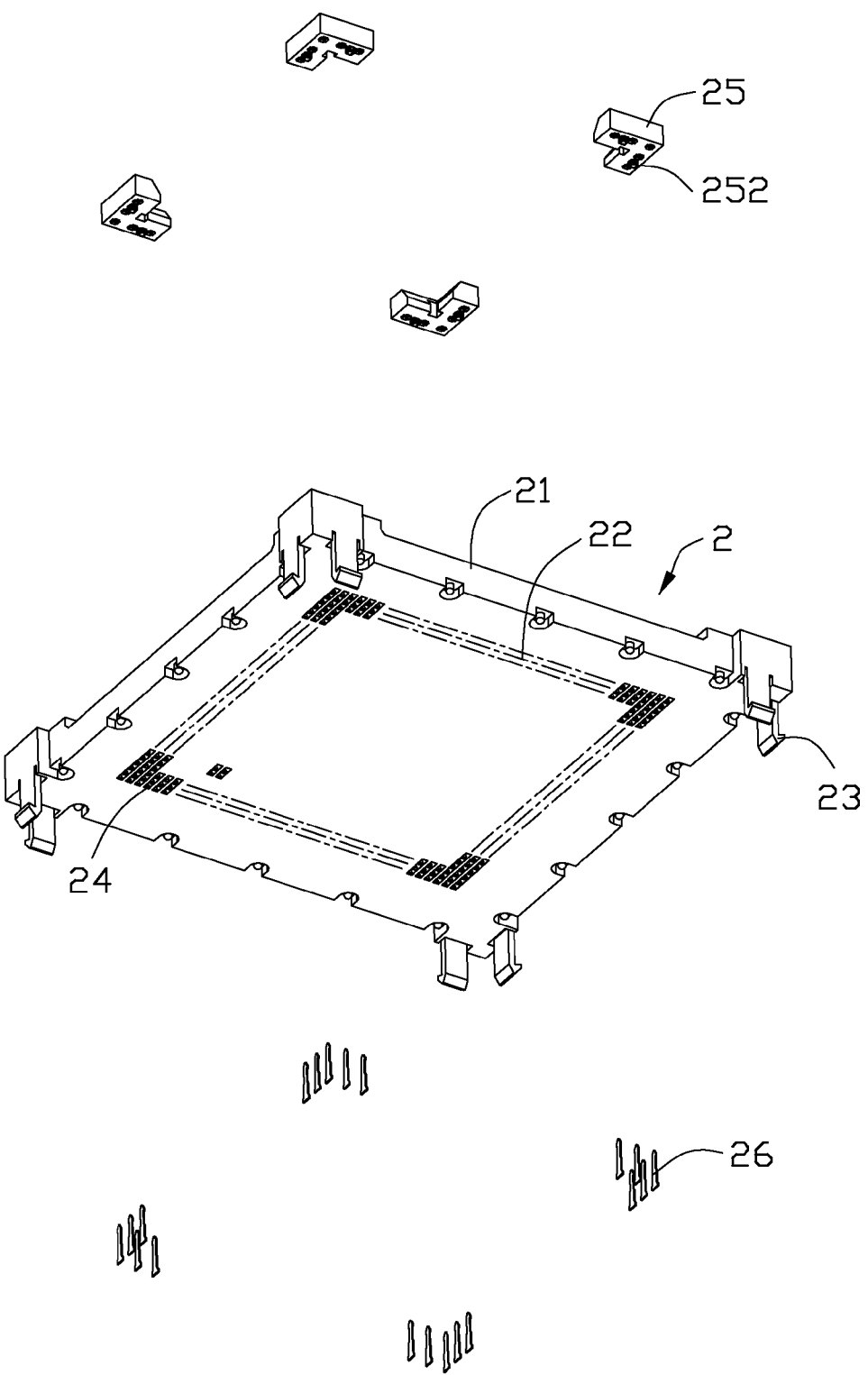
FIG. 6 is similar with FIG. 5, but taken from another side.

The position clumps 25 are firstly assembled on the bottom plate 20, with the positioning posts 252 of the positioning clump 25 insert into the passageways 22 of the bottom plate 20 from the top to the bottom to position the positioning clumps 25 in a horizontal direction; then the positioning tabs 26 are positioned in the passageways 22 of the bottom plate 20 from the bottom to the top and the slots 250 of the position clumps 25 to position the position clumps 25 on the loading board in a vertical direction, thus a whole loading member 2 is provided as shown in FIG. 3.

Referring to FIG. 2, when assembling the burn-in socket assembly 100, the contacts (not shown) are disposed within the base 1, the loading member 2 is mounted within the cavity 10 of the base 1, the heat sink 3 is assembled on the lid 4, finally, the lid 4 is pivotally assembled to the base 1 by the shaft 16, and the assembly is finished.

When in using, firstly the lid 4 is opened, then the IC package (not shown) is put on the loading member 2 by guiding of the guiding surfaces 251 of the positioning clumps 25 to be set in the opening surrounding by the positioning clumps 25, after that the lid 4 is rotated to a closed position and locked at that closed position by the locking member 43 engaging with the base 1, the IC package (not shown) and the loading member 2 are downwardly pressed by the lid 4.

The positioning clumps 25 of present invention can flexibly mounts to different passageways 22 of the bottom plate 20, so that the opening defined and surrounded by the positioning clumps 25 can be many different sizes. When people needs to test another IC package with a different size, the positioning tabs 26 are firstly removed from the bottom plate 21 and the positioning clumps 25, then the positioning clumps 25 of the loading members 2 are detached from the bottom plate 20 and then reassembled by theirs positioning posts 252 inserting into another corresponding passageways 22 on the bottom plate 20 to defines another adequate opening for the another IC package, finally, the positioning tabs 26 are retained to the another corresponding passageways 22 from the bottom to the top. No new element is required, so the burn-in socket can be repeatedly used, thereby producing cost is reduced and efficiency is improved.

However, the disclosure is illustrative only, changes may be made in detail, especially in matter of shape, size, and arrangement of parts within the principles of the invention.

What is claimed is:

1. A burn-in socket for receiving an IC package, comprising:
    a base defining a cavity for receiving the IC package; and
    a loading member retained in the cavity and having a loading board and a plurality of positioning clumps, the loading board having a bottom plate for loading the IC package, the positioning clump having an L shape configuration and detachably assembled upon the bottom plate to define a rectangular opening for positioning the IC package, together with other positioning clumps; wherein the bottom plate of the loading board defines a plurality of passageways, the positioning clump is provided with at least one positioning post on a bottom surface thereof, the positioning post inserts into the passageway of the bottom plate from the top to the bottom to position the positioning clump; wherein the loading member further has a plurality of positioning tabs detachably inserting into the passageways of the bottom plate from the bottom to the top to retain the positioning clump to the bottom plate; wherein the positioning tab also inserts into a through slot defined on the positioning clump; wherein the positioning tab is stamped from a metal piece, and comprises a central section, a header section extending upwardly and narrowing gradually from the central section and a tail extending downwardly and widening gradually from the central section; and a lid mounted upon the base, the lid comprises a lower cover pivotally assembled to the base, an upper cover pivotally assembled to the lower cover, and a locking member assembled on the upper cover and locking the upper cover with the base.

2. The burn-in socket as claimed in claim 1, wherein the posts of the positioning clumps can be inserted into different passageways to define different openings for different IC packages.

3. A burn-in socket comprising:
    an insulative base defining a plurality of receiving holes;
    a loading board discrete from but detachably attached upon the base, said loading board defining a plurality of passageways in vertical alignment with the corresponding receiving holes, respectively;
    a plurality of positioning clumps discrete from but detachably attached upon the loading board, the positioning clumps cooperatively defining a rectangular opening for compliantly receiving a corresponding IC package in the opening under condition that the IC package is directly seated upon the loading board wherein said base defines a cavity in which the loading board, the positioning clumps and the IC package are disposed; wherein the positioning clump is provided with at least one positioning post on a bottom surface thereof, the positioning post inserts into a corresponding passageway of the loading plate from the top to the bottom to position the positioning clump; wherein the positioning clump has an L shape configuration, an amount of the positioning clumps is four, and the four positioning clumps are located on four corners of the loading board; a plurality of positioning tabs detachably inserting into the passageways of the loading plate from the bottom to the top to retain the positioning clumps to the loading plate; wherein the positioning clump has at least one through slot, corresponding positioning tab inserts into the at least one through slot; wherein the positioning tab is stamped from a metal piece, and comprises a central section, a header section extending upwardly and narrowing gradually from the central section and a tail extending downwardly and widening gradually from the central section.

4. The burn-in socket as claimed in claim 3, wherein the positioning posts of the positioning clumps can be inserted into different passageways to define different openings for different IC packages.

5. A burn-in socket for use with an electronic package having a plurality of conductors formed on an underside thereof, comprising:
   a base;
   a plurality of contacts disposed in the housing for mechanically and electrically connecting to the corresponding conductors;
   a loading board positioned upon and assembled to the base for directly supporting the electronic package thereon;
   a plurality of passageways defined in the loading board and extending therethrough in a vertical direction for receiving either an upper sections of the contacts or the lower section of the conductors;
   a plurality of positioning clumps disposed along a periphery of the loading board and commonly defining a specific receiving region; wherein said positioning clumps are fastened upon the loading board via retention devices inserted into the corresponding passageways, respectively wherein said positioning clumps are located at corners of the loading board; wherein said loading board is discrete from while detachably attached to the base; wherein each of said positioning clumps further defines a downward post received in one corresponding passageway.

\* \* \* \* \*